United States Patent [19]

Suzuki

[11] Patent Number: 6,028,358
[45] Date of Patent: Feb. 22, 2000

[54] PACKAGE FOR A SEMICONDUCTOR DEVICE AND A SEMICONDUCTOR DEVICE

[75] Inventor: Katsunobu Suzuki, Tokyo, Japan

[73] Assignee: NEC Corporation, Tokyo, Japan

[21] Appl. No.: 08/866,306

[22] Filed: May 30, 1997

[30] Foreign Application Priority Data

May 30, 1996 [JP] Japan ..................... 8-137224

[51] Int. Cl.⁷ .................. H01L 23/495; H05K 7/20
[52] U.S. Cl. .................. 257/737; 257/700; 257/706; 257/778; 257/48; 257/713; 257/712; 257/686
[58] Field of Search .................. 257/700, 706, 257/737, 778, 48, 713, 686, 712

[56] References Cited

U.S. PATENT DOCUMENTS

| | | | |
|---|---|---|---|
| 4,829,403 | 5/1989 | Harding | 257/713 |
| 5,668,405 | 9/1997 | Yamashita | 257/737 |
| 5,763,939 | 6/1998 | Yamashita | 257/668 |

FOREIGN PATENT DOCUMENTS 405144995  6/1993  Japan ..................... 257/700

OTHER PUBLICATIONS

Electronic News, Mar. 6, 1995.
Nikkei Microdevices, pp. 61 to 65, Jun. 1995.
Electronic Materials, pp. 59 to 63, Oct. 1996.
Electronic News, Jan. 22, 1996.
Electronic Components and Technology Conference, pp. 707 to 712, 1996.
Electronic Components and Technology Conference, pp. 1217 to 1221, 1996.
Electronic Components and Technology Conference, pp. 1271 to 1277, 1996.

*Primary Examiner*—Brian Dutton
*Assistant Examiner*—Hung Van Duong
*Attorney, Agent, or Firm*—Whitham, Curtis & Whitham

[57] ABSTRACT

A semiconductor package and semiconductor device are provided which enable manufacturing of same with ease of inspection, good reliability, and good thermal characteristics. An insulator made of an organic material and a wiring pattern formed by a metallic foil are formed on top of a metallic base substrate, thereby forming a laminated structure. The metallic base substrate has a plurality of electrically insulated continuity checking terminals. The metallic base substrate, the continuity checking terminals, and the wiring pattern are connected by via holes which pass through the insulator at prescribed locations. The insulator and wiring pattern is removed at a prescribed location at which a semiconductor chip is to be mounted. The exposed metallic base substrate is formed as a cavity of a prescribed depth.

14 Claims, 12 Drawing Sheets

PACKAGE FOR A SEMICONDUCTOR DEVICE AND A SEMICONDUCTOR DEVICE

BACKGROUND OF THE INVENTION

1. Field of the Invention

The present invention relates to a semiconductor device and to a package for a semiconductor device, and more specifically it relates to the structure of a package for a semiconductor device that uses a metallic substrate.

2. Description of Related Art

A semiconductor package structure known as BGA (ball grid array) has been proposed in recent years. This type of package structure is noted, for example, in "Electronic News" of Monday, Mar. 6, 1995 (hereinafter referred to as reference 1) and on page 63 of the June 1995 issue of "Nikkei Microdevice" (hereinafter referred to as reference 2), and efforts are being made to achieve practical application thereof. The BGA structure of the past will be explained hereunder with reference to a drawing.

FIG. 10 shows a cross-sectional view of the BGA (Super BGA) of Amkor/Anam company as the first prior art, which is noted in reference 1.

In the structure of this package, an insulator 100 is provided on the top of a metallic substrate 97, and a prescribed wiring pattern 102 is further formed on the top thereof.

A wiring pattern 102 on which a solder ball 101 is to be bonded, is also provided.

With the exception of part of the wiring pattern onto which is provided the solder ball 101 and part of the wiring pattern which is used for wire bonding, the structure is covered by an insulator 105.

The metallic substrate 97 is exposed at the part on which is mounted a silicon chip 99, the silicon chip 99 being bonded thereto by using a mounting material 98.

The electrodes of this silicon chip 99 and prescribed locations of the wiring pattern are connected together by bonding wires 103. The silicon chip 99, the bonding wires 103, and the surrounding area thereof are sealed by a sealing resin.

FIG. 11 shows a cross-sectional view of the second prior art BGA, which is noted in reference 2. In the structure of this package, a wiring pattern 109 is formed on the top of an insulator 107. The electrodes of the silicon chip 108 and the ends of the wiring pattern 109 are electrically connected using TAB (tape automated bonding).

This construction is usually called as a device hole. The part of the insulator 107 at which the silicon chip 108 is mounted is removed. With the exception of the ends of the wiring pattern 109 onto which are provided solder balls 112, the electrodes of the silicon chip 108, and the ends of the wiring pattern 109 which are TAB connected to the electrodes of the silicon chip 108, the structure is covered by a covering insulator 110.

To maintain flatness, a support ring 106 is provided around the outer edges of the package. The silicon chip 108 and the surrounding area are sealed using a sealing resin 111.

In the BGA package structure described above as the first prior art, it is not possible to observe and inspect the condition of connection after mounting.

Additionally, with regard to the reliability of the connection after mounting is also unstable, and further since stress is generated in the connection part by virtue of the difference in coefficients of thermal expansion between the material of the substrate and the metal used in the package.

With regard to the BGA structure described above as the second prior art, it is difficult to effectively dissipate heat that is generated at the junction part of the silicon chip, making it difficult to achieve a low thermal resistance.

Additionally, because the part on which a solder ball is formed is a flexible film, heat which is applied then mounting causes a deterioration of the flatness thereof, resulting in a worsening of mounting yield.

Furthermore, because the part used for electrical connection is only one layer of the wiring pattern, it is not possible to use a laminated structure such as has been used in the past to improve ground and power supply potentials with ceramic packages.

There were a number of unsolved problems with regard to prior art BGA structures such as described above.

In view of the above-described prior art and the problems involved therewith, an object of the present invention is to provide a package structure which is an improvement over the BGA structure of the past, enables sufficient electrical performance to be achieved from an LSI device, promotes the achievement of a low thermal resistance, and facilitates mounting inspection.

SUMMARY OF THE INVENTION

To achieve the above-noted object of the present invention, a package of a semiconductor device of the present invention basically has the technical conception in that a semiconductor device package comprises a multi-layer laminated substrate comprising a metallic base substrate, an insulation layer and a metallic film layer having a configuration formed in a predeterminedly designed wiring pattern, and wherein at least one continuity checking terminal is provided at a portion of the metallic base substrate in the multi-layer laminated substrate and opposite to a part of the wiring pattern, the continuity checking terminal being separated from the metallic base substrate and also being electrically insulated from the metallic base substrate, further wherein at least one solder ball is provided on a surface of the wiring pattern which is a reverse side of a surface thereof being opposite to the metallic base substrate, and at a point on the wiring pattern opposite to a point at which the continuity checking terminal is provided.

In accordance with one embodiment of the present invention, a semiconductor package is formed as a laminate of a metallic base substrate comprising a metallic plate made of, for example, either copper or aluminum as the chief component, and having a prescribed configuration, for example, a wiring pattern formed thereon, an insulator made from an organic insulating substance that is formed at least over the above-noted metallic base substrate, and a thin-film wiring pattern formed by metallic film having a prescribed wiring pattern that is formed thereover.

The above-noted metallic base substrate has a electrical continuity checking terminal pattern therein and formed by a plurality of discrete and electrically insulated terminals, at least the electrical continuity checking terminals being electrically connected to the wiring pattern by means of via holes which are provided on a predetermined portions in an insulator and through the insulator.

The insulator and wiring pattern formed at the location at which the semiconductor chip is to be mounted are removed and then this portion is formed into a cavity in which the metallic base substrate is exposed, this cavity being of a prescribed depth.

With the exception of the part of the wiring pattern onto which are mounted solder balls for the purpose of external connections and the bonding portion on the wiring pattern used to make electrical connections to the semiconductor chip, the structure is covered with a covering insulator made of an organic insulating substance.

Additionally, the construction of a semiconductor device according to the present invention is such that semiconductor chip either is mounted in a package according to the present invention by bonding, using either a low-melting-point metal or a resin containing an organic metal, or is mounted by flip-chip connection using bumps so as to make electrical connections, after which it is sealed using an organic resin.

DRAWING DESCRIPTION OF THE DRAWINGS

Figure 12A:
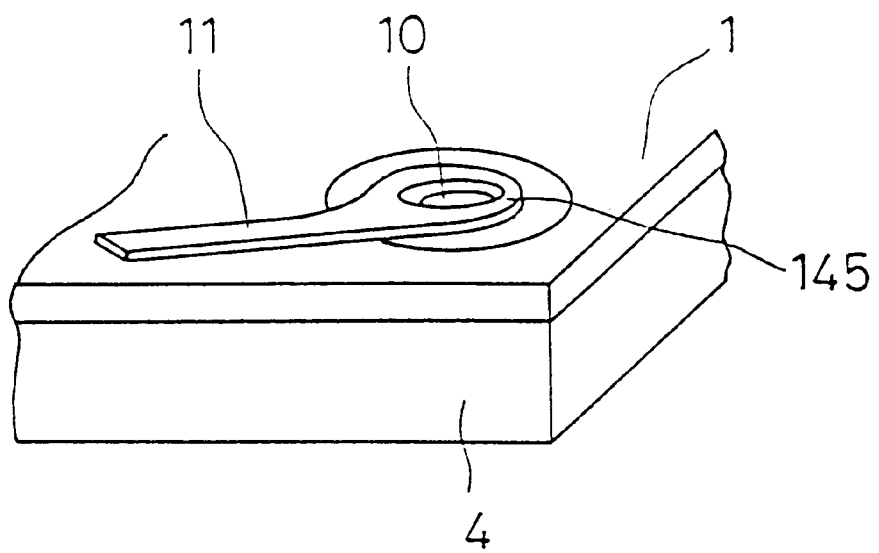
Figure 12B:
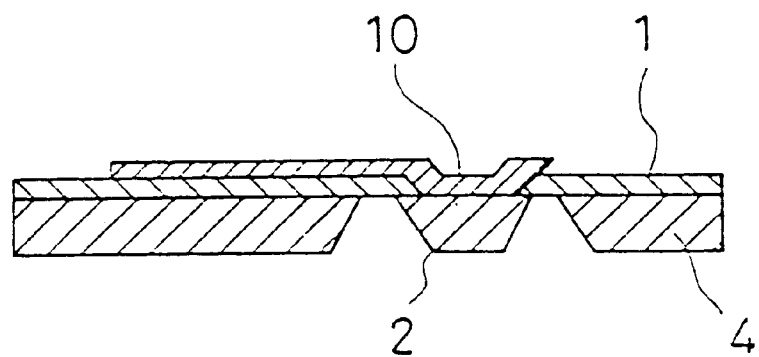

FIGS. 12 (A) and 12 (B) show an embodiment of a connecting structure formed between a via hole and a connecting wire in the present invention.

DETAILED DESCRIPTION OF THE PREFERRED EMBODIMENTS

Embodiments of the present invention are described more precisely below, with reference to relevant accompanying drawings.

Figure 1A:
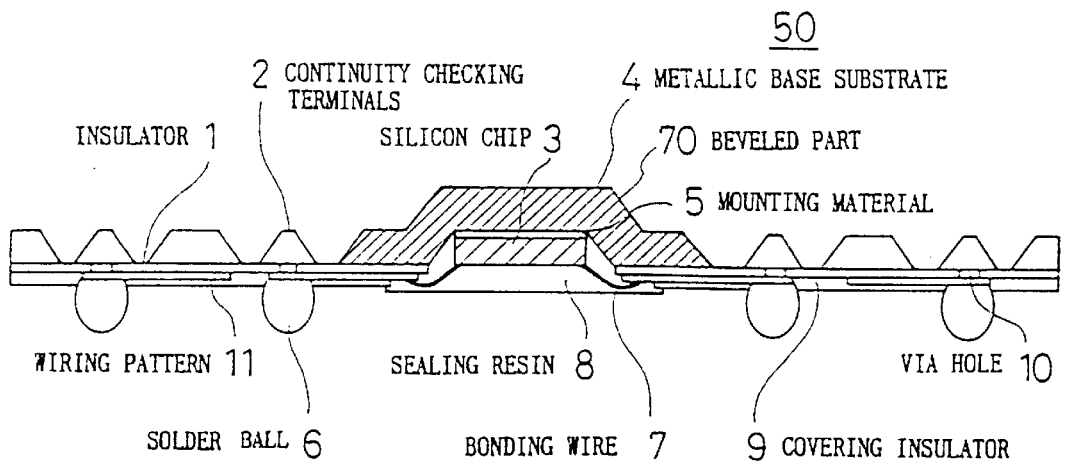
FIG. 1 (A) is a cross-sectional view.
FIG. 1(B) is a perspective view which show the structure of the first embodiment of the present invention.
Figure 1B:
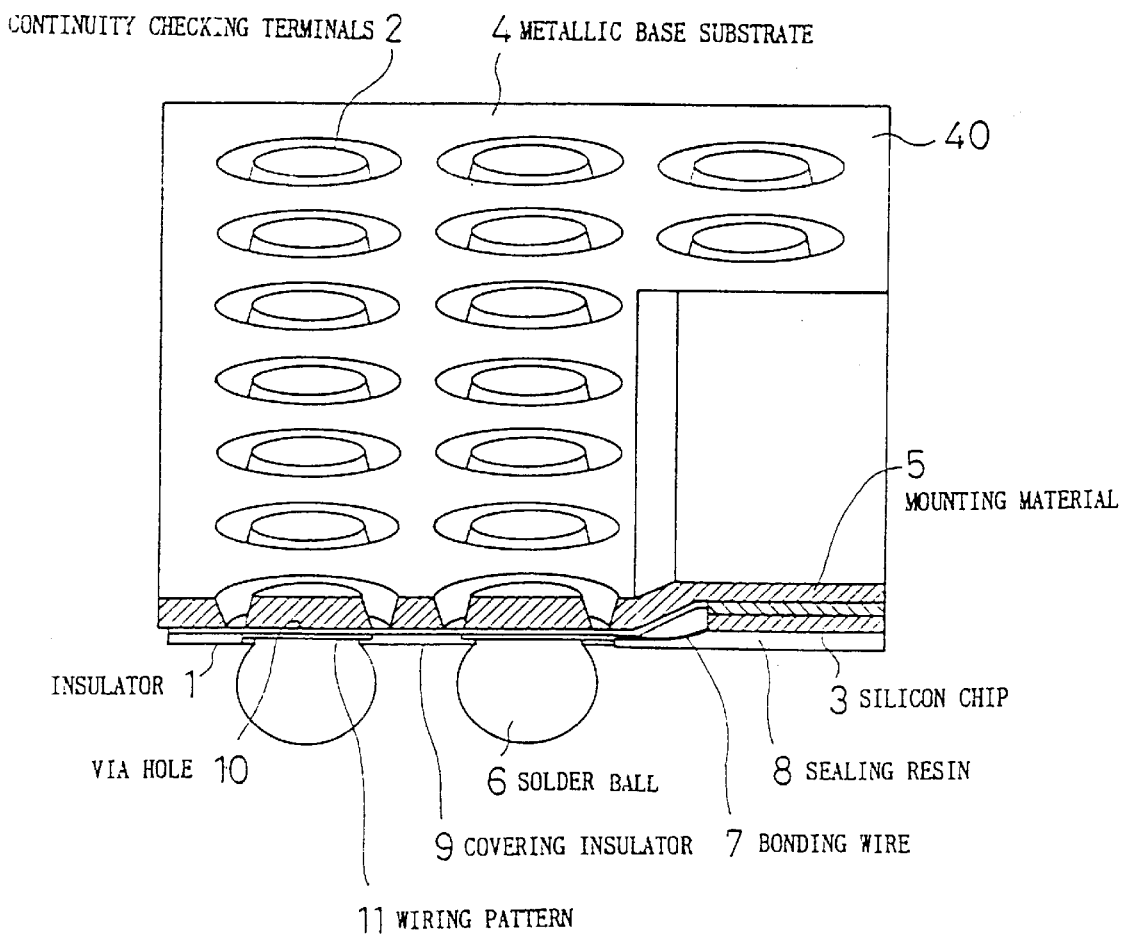

FIG. 1 (A) and FIG. 1 (B) are, respectively, a cross-sectional view and a perspective view which show a metal BGA package according to the first embodiment of the present invention. In these Figs., a semiconductor device package 50 of the present invention is shown in that the package 50 comprises a multi-layer laminated substrate comprising a metallic base substrate 4, an insulation layer 1 and a metallic film layer 11 having a configuration formed in a predeterminedly designed wiring pattern, and wherein at least one continuity checking terminal 2 is provided at a portion of the metallic base substrate 4 in the multi-layer laminated substrate and opposite to a part of the wiring pattern 11 with respect to the insulation layer 1, the continuity checking terminal 2 being separated from the metallic base substrate 4 and also being electrically insulated from the metallic base substrate 4, further wherein at least one solder ball 6 is provided on a surface of the wiring pattern 11, the surface of which is a reverse side of a surface thereof being opposite to the metallic base substrate 4, and at a point on the wiring pattern opposite to a point at which the continuity checking terminal 2 is provided.

Note that as shown in FIGS., 1(A) and 1(B), in the above-mentioned package structure 50 of the first embodiment of the present invention, it comprises a 20 to 55 $\mu$m thick layer of polyimide film 1 (hereinafter referred to as the insulator) is provided on top of surface of a 0.15 to 0.20 mm thick substrate 4 of copper (hereinafter referred to as the metallic base substrate), and a wiring pattern 11 for the purpose of running electrical connections around the surface of the substrate formed by an 18 to 35 $\mu$m-thick copper foil 11, are formed over the insulator 1.

On the reverse side of the above-noted metallic base substrate, a pattern 40 that supports the laminate and a pattern 2 of plurality of discrete continuity checking terminals which are electrically insulated therefrom are formed separately by means of patterning.

With the exception of the continuity checking terminal pattern 2, the metallic base substrate 4 supporting the above-noted structure is set electrically at ground potential.

This electrically insulated continuity check terminals 2 is electrically connected to the wiring pattern 11 that is formed by copper film. The electrical connection passes through the insulator 1 at prescribed locations, by via holes 10 that are buried by means of metallic soldering in the insulator.

In the prescribed position for mounting the silicon chip 3, the insulator 1 and wiring pattern 11 are removed, thereby exposing the metallic base substrate 4, and forming a cavity. This cavity is made to have a prescribed depth, therein.

With the exception of a prescribed part of the wiring pattern 11 onto which is provided solder balls 6 as terminals for external connections and a part of the wiring pattern 11 which is used for electrical bonding, the structure is covered by a covering insulator 9, which is made of an organic insulating material. The above-described structure is that of a metal BGA package according to the first embodiment of the present invention.

Next, using a conductive mounting material 5, such as sliver paste which has a high thermal conductivity, the silicon chip 3 is bonded into the cavity depression which had been formed in the metallic base substrate 4, bonding wires 7 being used to make connections between the electrodes of the silicon chip 3 and prescribed locations on the internal wiring pattern 11.

Then, the silicon chip 3, the bonding wires 7, and part of the wiring pattern 11 are sealed by using a sealing resin 8 which is, for example, an epoxy resin.

Finally, solder balls 6 are provided at prescribed positions on the wiring pattern 11, over which the covering insulator 9 has not been coated.

As explained above, one of the characteristic features of the present invention is such that the continuity checking terminal 2 is formed with the wiring pattern 11 so as to be flexible to the metallic base substrate 4 and another feature is such that the continuity checking terminal 2 and a predetermined part of the wiring pattern 11 are connected to each other through a via hole 10 provided in the insulation layer 1.

More over, in the present invention, at least a part of the wiring pattern 11 is connected to at least one of connecting pad formed on the semiconductor chip 3 which is mounted on a surface of the metallic base substrate 4 through a suitable connecting means, and further in the present invention, the semiconductor chip 3, the connecting means 7, 27, and a part of the wiring pattern 11 are sealed with a suitable sealing material 8.

FIGS. 12 (A) and 12(B) show one embodiment of a construction of the connection portion formed among the continuity checking terminal 2, the end of wiring and the solder ball 6, in the present invention.

As apparent from these figures, a via hole 10 is provided in the insulation film 1 and the continuity checking terminal 2 (it is also called as a metallic base land) and an end of the wiring pattern 11 are electrically connected each other through the via hole 10.

On the other hand, an end portion of the wiring pattern 11 is formed into a circular shape 145 with having a cavity portion in a center part of the circular shaped portion and which is connected to the center of the via hole.

This circular shaped portion 145 of the wiring pattern to be connected to the via hole is generally called as a land pattern.

Note that on the center portion of the land pattern, the solder ball 6 is mounted.

Figure 2:
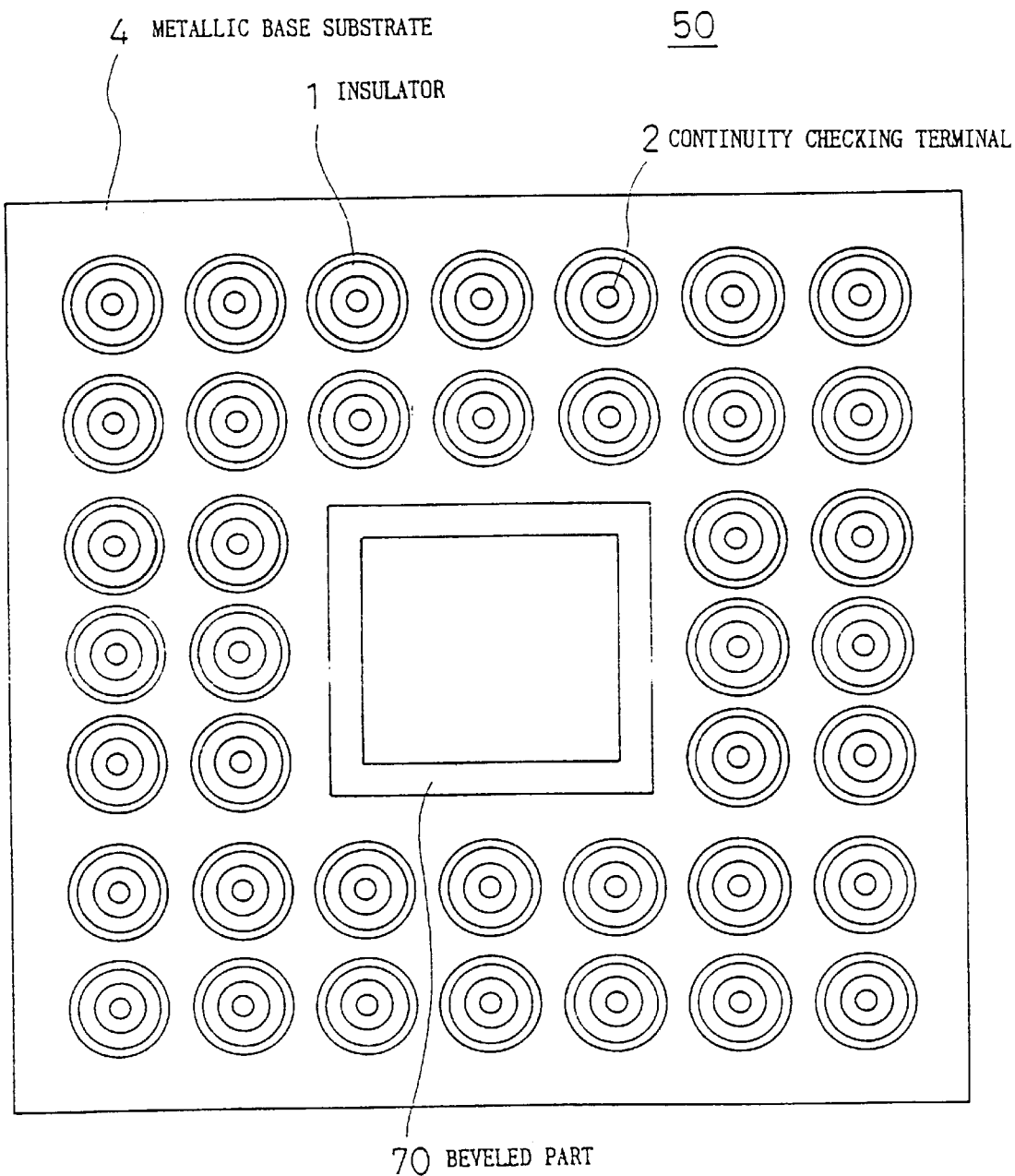
FIG. 2 is a plan view which shows the reverse side of structure of the first embodiment of the present invention.

FIG. 2 shows a plan view of the metal BGA package of the first embodiment of present invention as viewed from the metal base substrate side. In this case, solder balls 6 are formed on the reverse side of the continuity checking terminals 2.

A package in which solder balls (otherwise called solder balls) are provided in a grid arrangement is of a construction known as a ball grid array (BGA), and a BGA which uses a metallic base substrate 4 is more specifically known as an metal BGA (metal ball grid array).

The most salient feature of the construction of an metal BGA is the patterning of a 0.15 to 0.20 mm thick metal sheet by means of etching, and the separation of the electrically insulated metallic base substrate 4 from the continuity checking terminals 2. In this embodiment of the present invention, a beveled part 70 is provided on the metallic base substrate 4 so that the silicon chip 3 is mounted flat on the reverse side.

Figure 3:
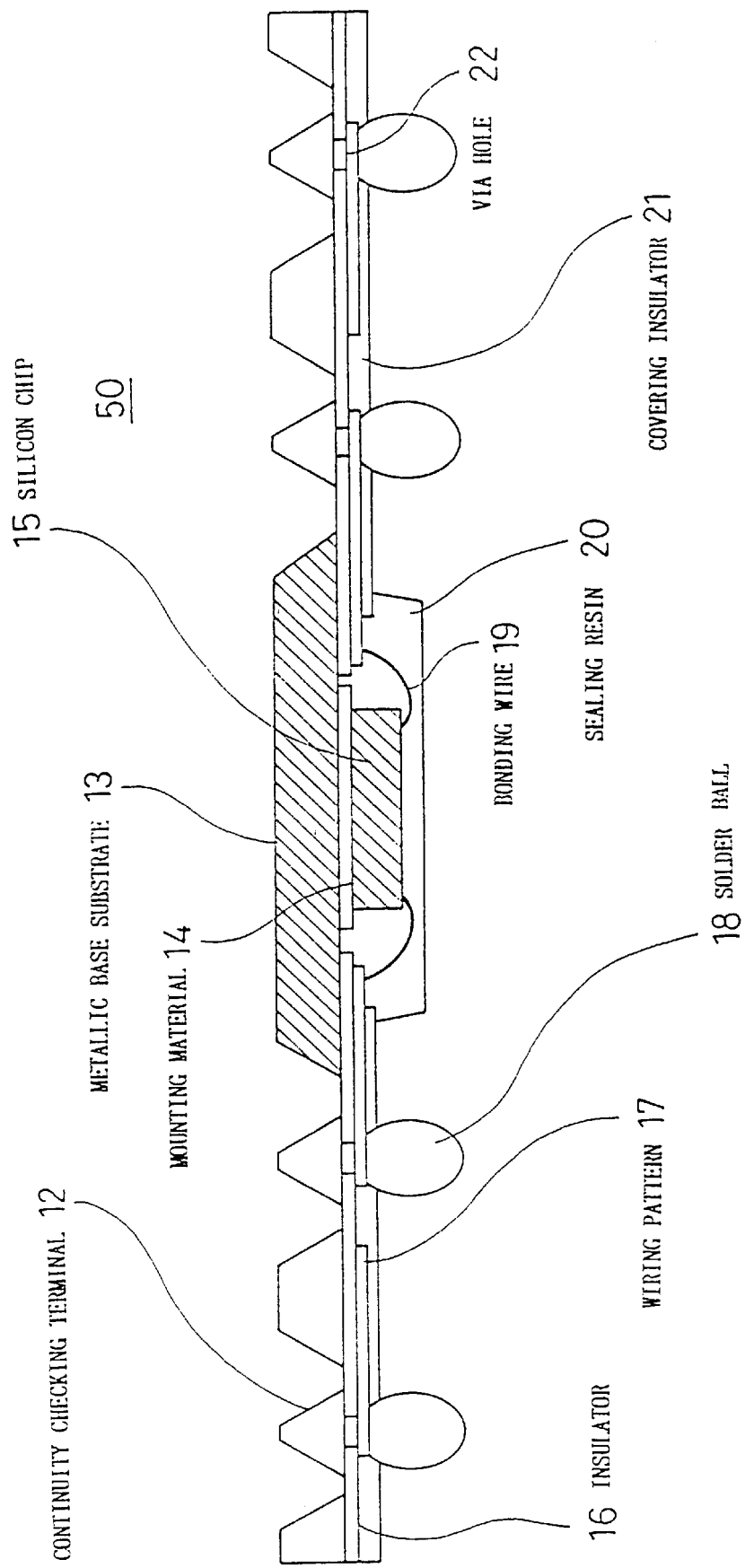
FIG. 3 is a cross-sectional view which shows the structure of the second embodiment of the present invention.

FIG. 3 is a drawing which shows the cross-sectional structure of an metal BGA representing the second embodiment of the present invention. In this embodiment, in contrast to the first embodiment, there is no depression in the metallic base substrate 13 onto which is mounted the silicon chip 15, the construction being flat.

A silicon chip 15 is mounted on this flat metallic substrate base 13 by using a conductive mounting material 14, such as sliver paste 13, which has a high thermal conductivity, bonding wires 19 being used to make connections between the electrodes of the silicon chip 15 and wiring pattern 17.

Then, the silicon chip 15, the bonding wires 19, and part of the wiring pattern 17 are sealed by using a sealing resin 20 such as an epoxy resin. Finally, solder balls 18 are provided at positions on the wiring pattern 17 over which the covering insulator 21 has not been coated.

Figure 4:
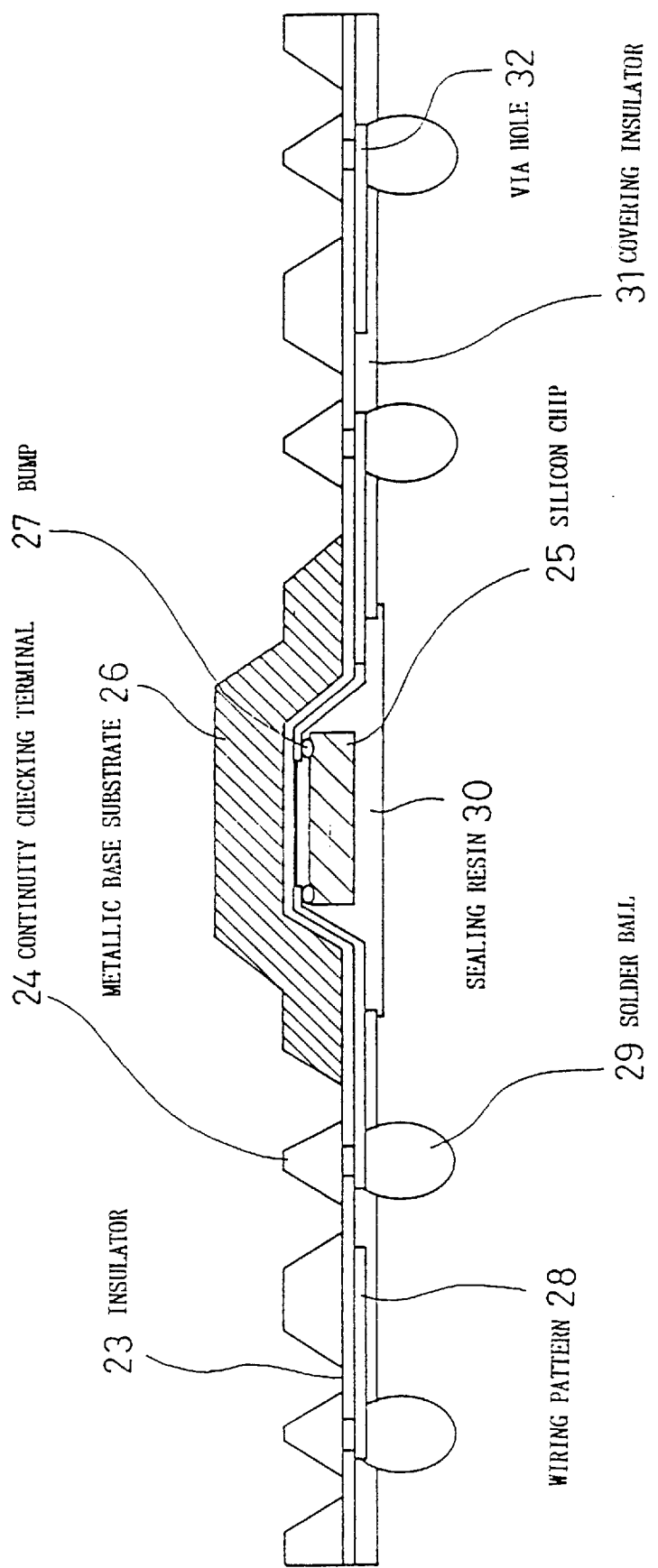
FIG. 4 is a cross-sectional view which shows the structure of the fourth embodiment of the present invention.

FIG. 4 is a drawing which shows the cross-sectional structure of an metal BGA according to the third embodiment of the present invention. The basic structure is the same as the first embodiment. This package configuration is for the mounting of a silicon chip 25 using flip-chip connections.

In this embodiment, the insulator 23 on the part of the metallic base substrate where the silicon chip 25 is mounted is not removed. The wiring pattern 28 extends to the bottom surface of the depression portion.

This depression is formed by a pressing or drawing process utilizing a suitable die simultaneously with the metallic base substrate 26, the insulator 23, and the wiring pattern 28. A bump 27 is provided at the tip of each part of the wiring pattern 28 that corresponds to an electrode of the silicon chip 25, thereby making electrical connection to the silicon chip 25.

Next, flip-chip connections are made between the electrodes of the silicon chip 25 and the bumps 27, and silicon chip 25 and the surrounding area thereof are sealed by using a sealing resin 30 which is, for example, an epoxy resin. After that, solder balls 29 are placed in prescribed locations.

Figure 5:
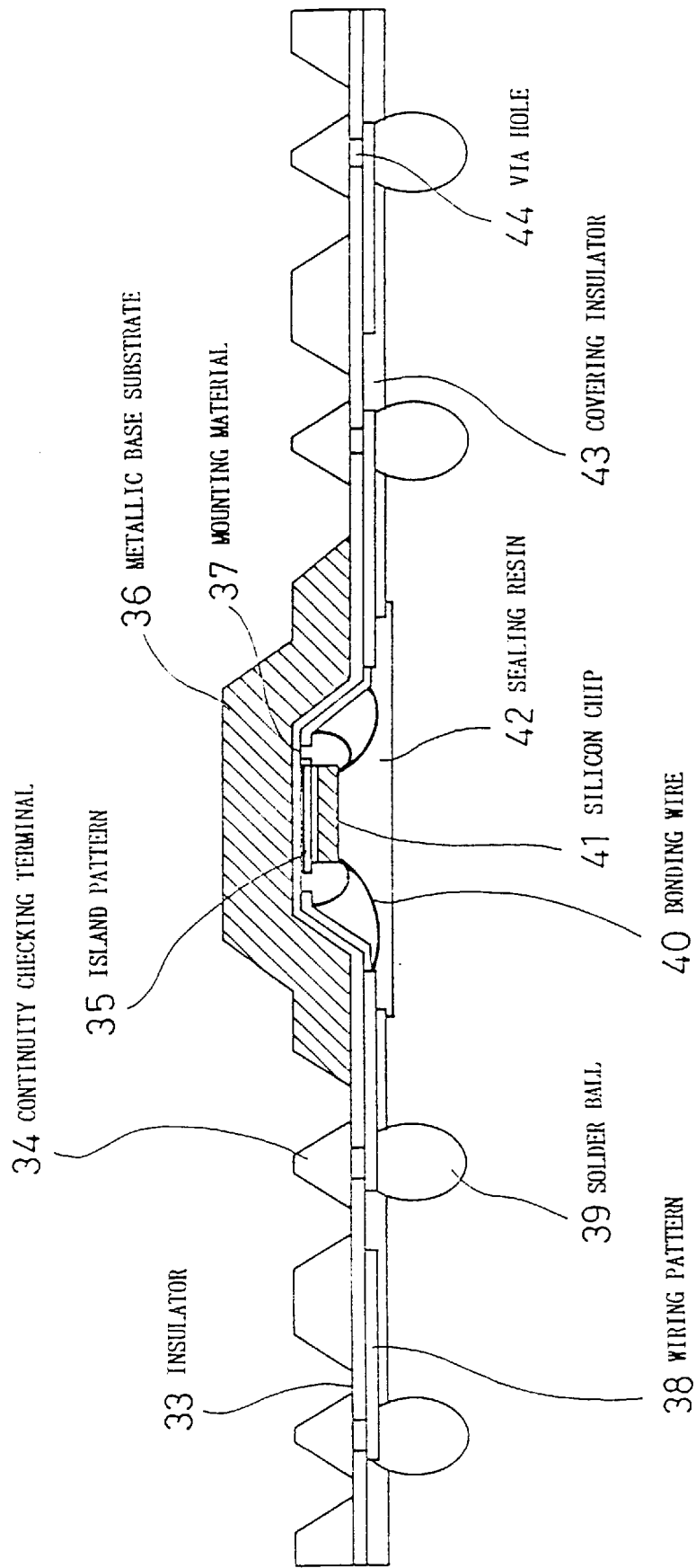
FIG. 5 is a cross-sectional view which shows the structure of the fourth embodiment of the present invention.

FIG. 5 is a drawing which shows the cross-sectional structure of an metal BGA according to the fourth embodiment of the present invention. The basic structure is the same as the third embodiment, except that the electrical connections of the wiring pattern 38 to the silicon chip 41 are made by using bonding wires.

An island pattern 35 is provided by forming this with a copper foil film at the location of mounting the silicon chip 41. The ends of the wiring pattern 38 which are connected to the silicon chip 41 by bonding wires 40 are provided at the bottom and around the upper edge of a depression.

The silicon chip 41 is mounting over the island pattern 35 using a mounting material 37, such as silver paste. The electrodes of the silicon chip 41 and the wiring pattern 38 are connected by means of the bonding wires 40. Then, the silicon chip 41, the bonding wires 40, and the surrounding area thereof are sealed by using a sealing resin 42 which is, for example, an epoxy resin. After that, as was the case for the third embodiment, solder balls 39 are placed in prescribed locations.

Figure 6:
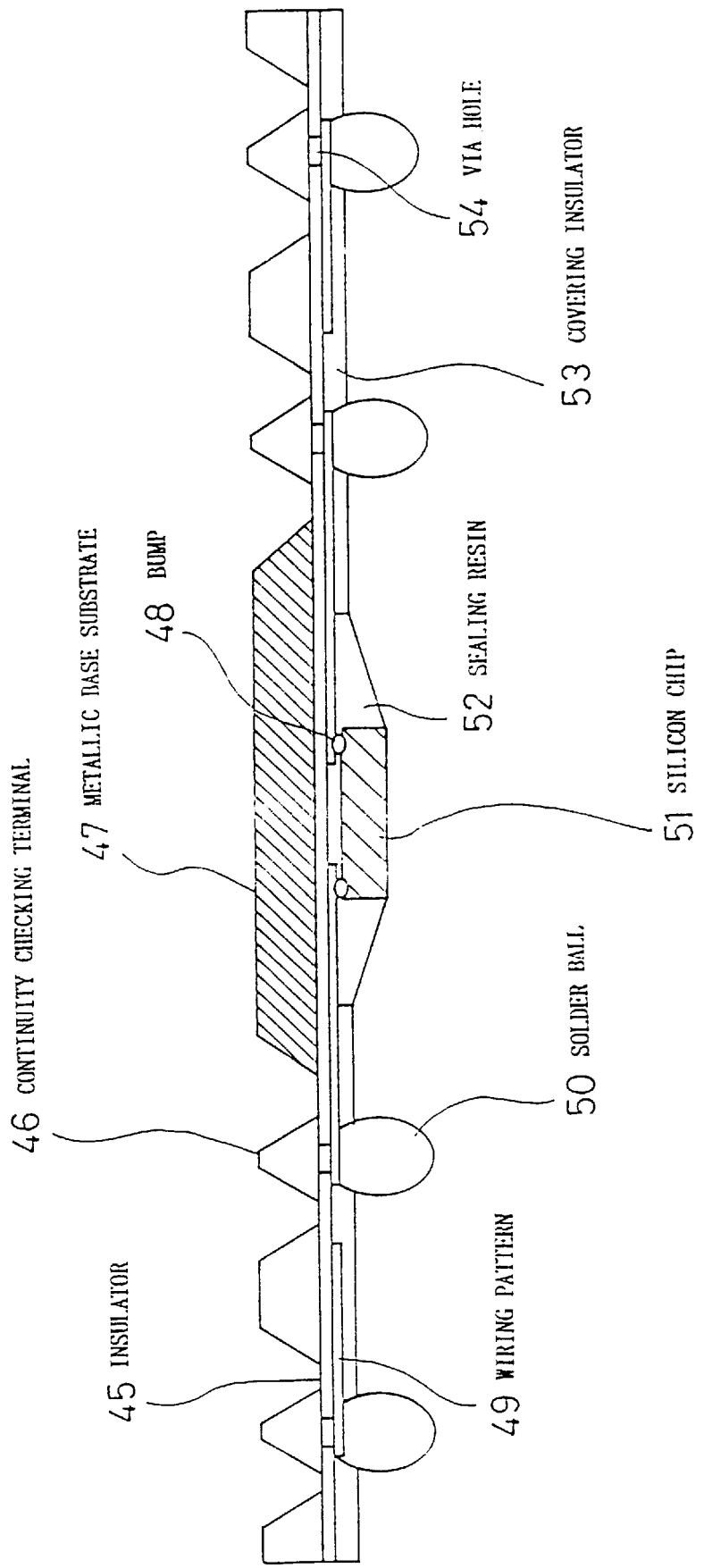
FIG. 6 is a cross-sectional view which shows the structure of the fifth embodiment of the present invention.

FIG. 6 is a drawing which shows the cross-sectional structure of an metal BGA according to the fifth embodiment of the present invention. As is the case with the third embodiment, this structure is for the purpose of making flip-chip connections. The part of the metallic base substrate 47 onto which the silicon chip 51 is mounted is flat. Flip-chip connections are made to prescribed electrodes of the mounted silicon chip 51 by means of corresponding bumps 48.

Then, the area between the side walls and surface of the silicon chip 51 and the insulator 45 are sealed by using a sealing resin 52 which is, for example, an epoxy resin. After that, solder balls 50 are placed in prescribed locations, as was done in previously described embodiments.

Figure 7:
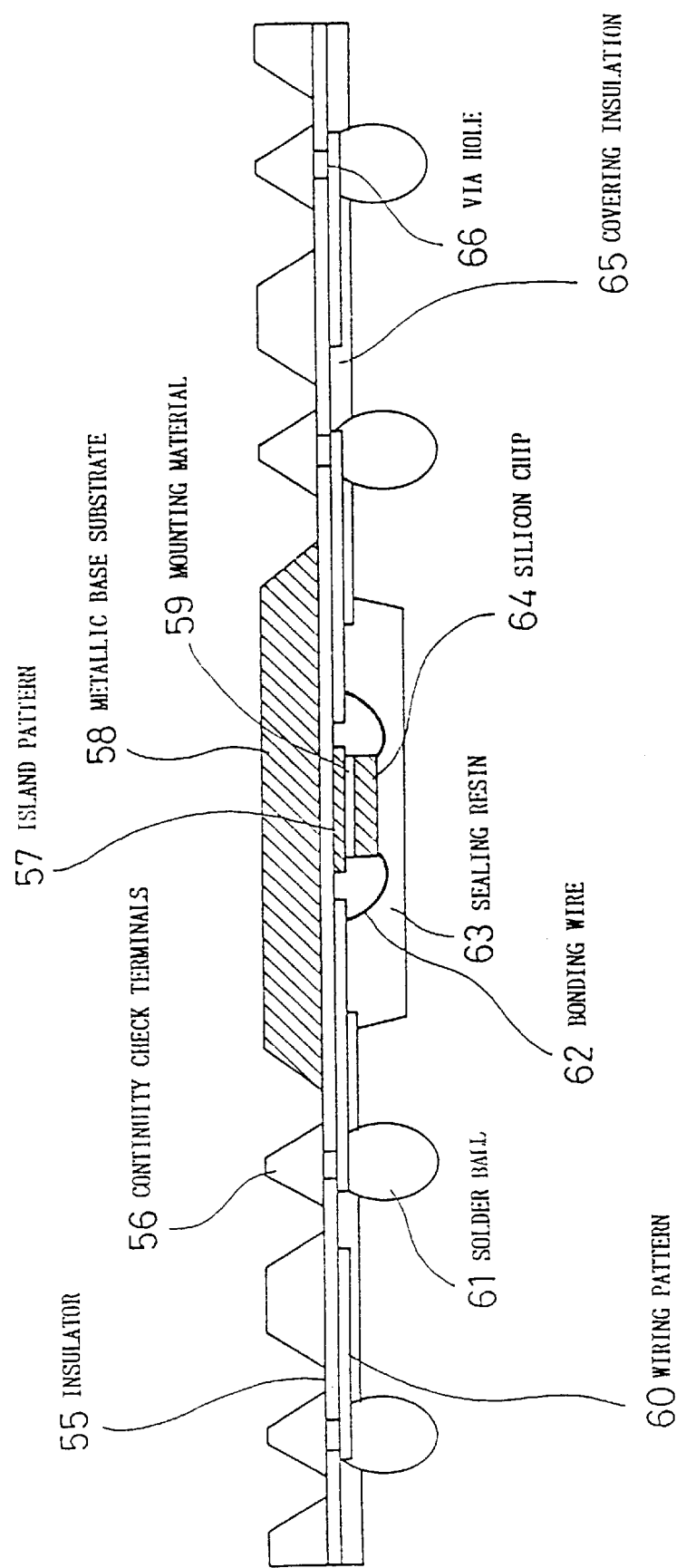
FIG. 7 is a cross-sectional view which shows the structure of the sixth embodiment of the present invention.

FIG. 7 is a drawing which shows the cross-sectional structure of the sixth embodiment of the present invention. As is the case with the fourth embodiment, this structure is for the purpose of making connections by wire bonding.

The metallic base substrate 58 onto which the silicon chip 64 is mounted is flat. The silicon chip 64 is mounted onto the island pattern 57 formed from copper foil film by using a mounting material 59, such as silver paste.

Bonding connections are made between the electrodes of the silicon chip 64 and the prescribed wiring pattern 60 by means of bonding wires 62. Then, the silicon chip 64, the bonding wires 62 and the surrounding area are sealed using a sealing material 63.

Figure 8:
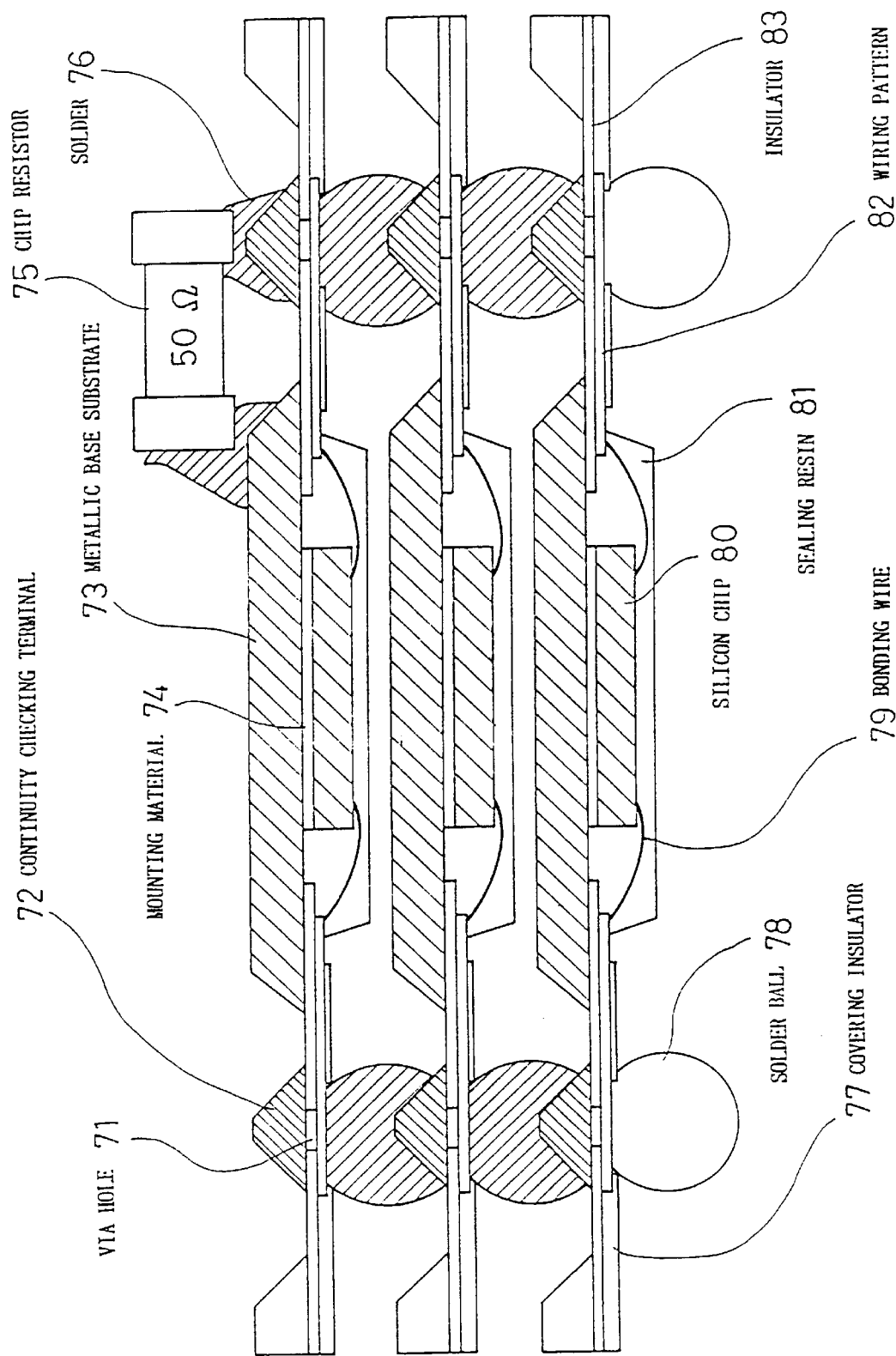
FIG. 8 is a cross-sectional view which shows the structure of the seventh embodiment of the present invention.

FIG. 8 is a drawing which shows the cross-sectional structure of a modularized metal BGA according to the seventh embodiment of the present invention. Although this drawing shows the example of a structure that is basically the same as the second embodiment, it is also possible to use the metal BGA structures of other embodiments.

This structure, in which a plurality of metal BGAs are stacked together, is particularly effective for use with LSI devices such as memories.

First, semiconductor devices having a structure as described with regard to the second embodiment are stacked, using the solder balls 78 and the continuity checking terminals 72 so as to contact to each other, these being electrically connected by means of soldered joints.

The structure shown in FIG. 8 is used in the case in which the metallic base substrate 73 is set to the ground potential and continuity checking terminals 72 are used for signals. It is possible to have chip components such as a chip resistor 75 bridge across the metallic base substrate 73 and a continuity checking terminal 72, this being mounted in place using solder 76. This can be used to perform impedance matching within the package.

Figure 9:
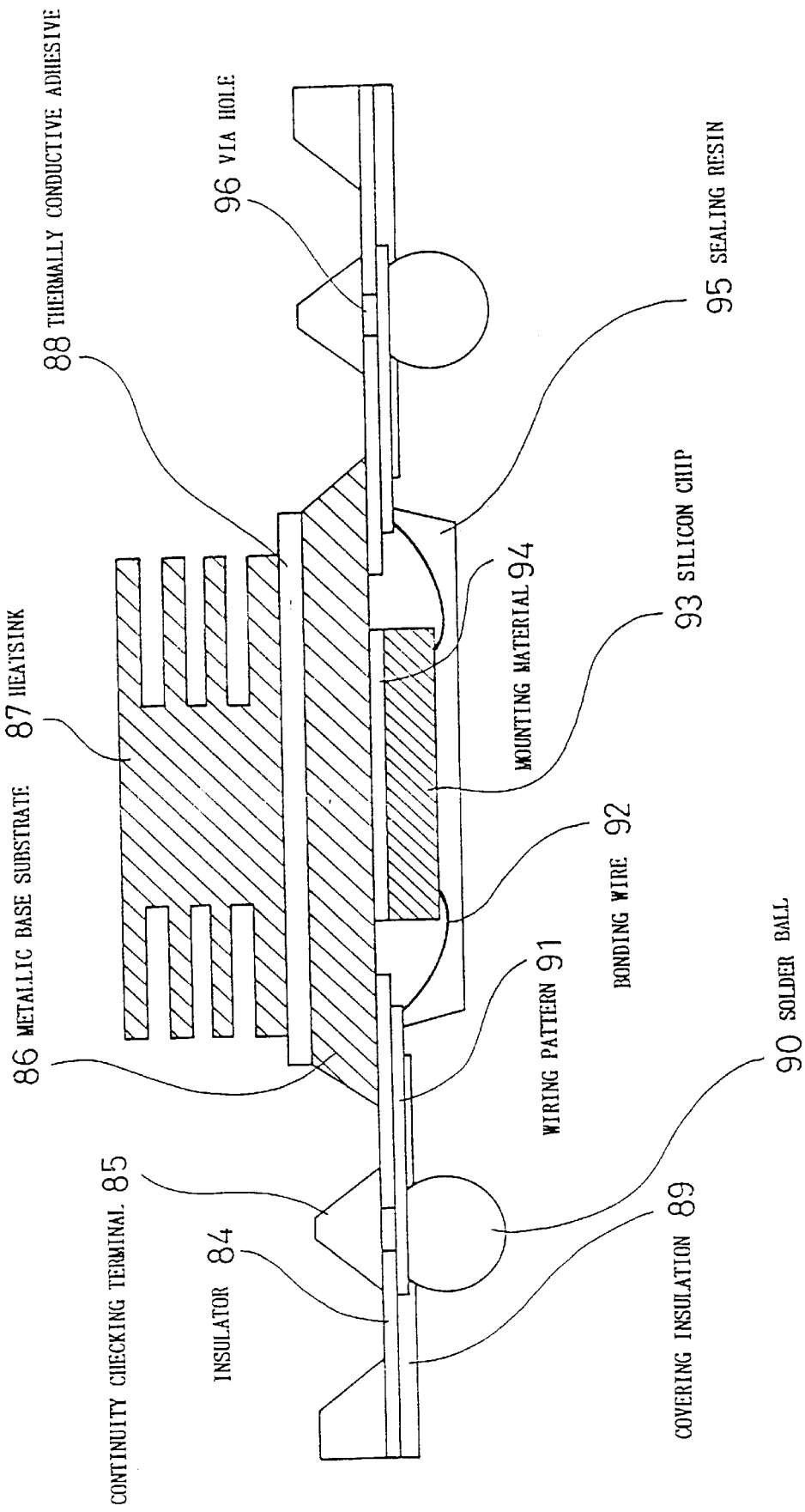
FIG. 9 is a cross-sectional view which shows the structure of the eight embodiment of the present invention.
Figure 10:
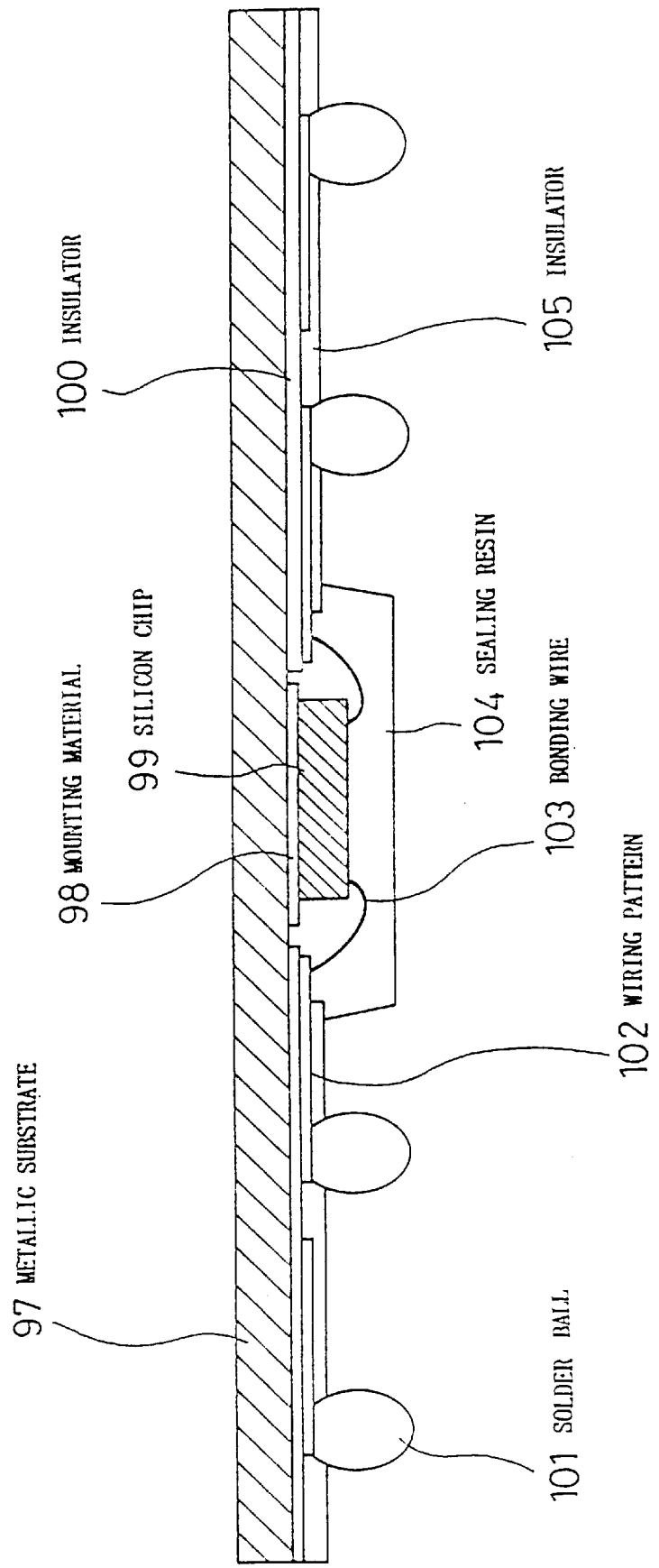
FIG. 10 is a cross-sectional view which shows the first prior art.
Figure 11:
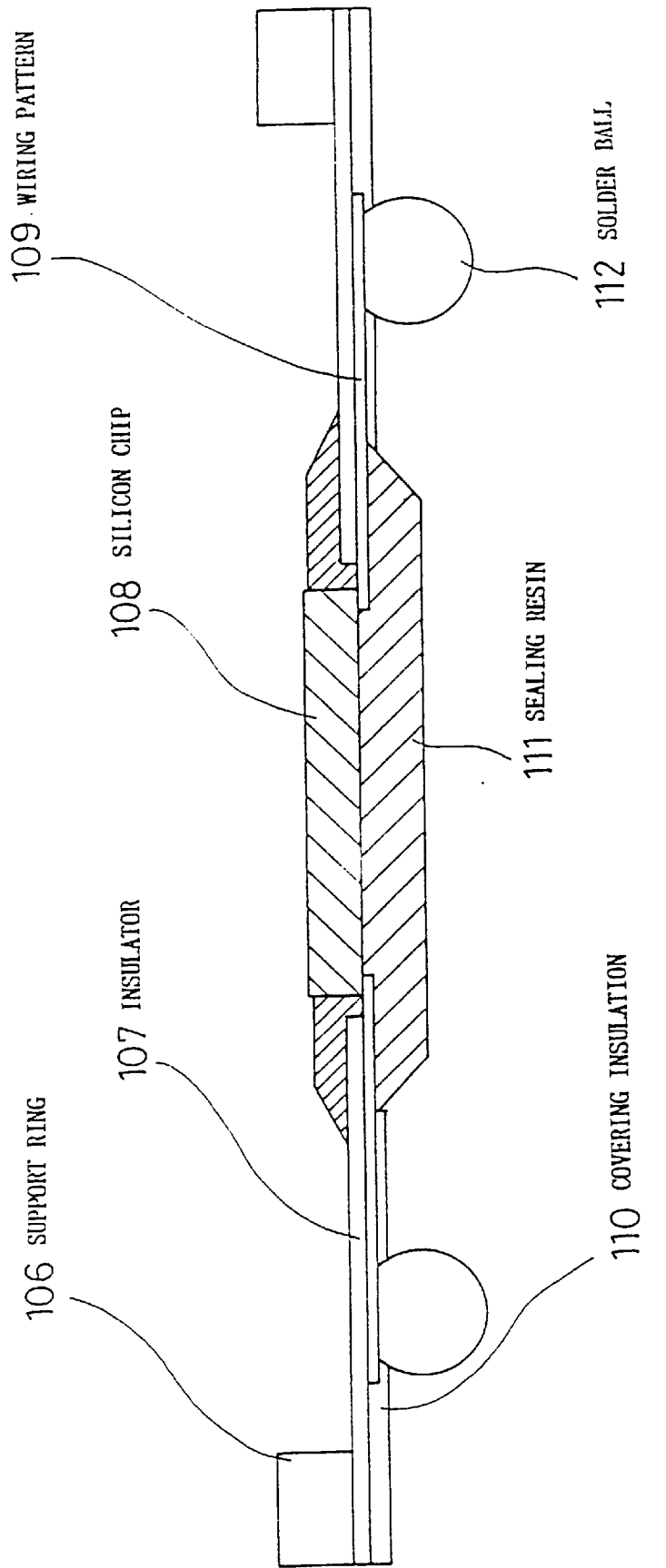
FIG. 11 is a cross-sectional view which shows the second prior art.

FIG. 9 shows a cross-sectional structure for the purpose of achieving a low thermal resistance, this representing the eighth embodiment of the present invention. Although this drawing shows the example of a structure that is based on the structure of the second embodiment, it is also possible to use the metal BGA structures of other embodiments.

A thermally conductive adhesive 88 is used to mount a heatsink 87 on the top of the metallic base substrate 88 which makes contact with the reverse side of the silicon chip 93.

As described above with regard to the various embodiments, a package according to the present invention has a structure that makes use of a metallic base substrate, thereby achieving high electrical performance, ease of inspection, and high reliability. With regard to inspection of connections and the reliability thereof in particular, it is possible to view the solder ball connections through the insulator from between a continuity checking terminal and the metallic base substrate. Using the continuity checking terminals, it is possible to check continuity before and after mounting. Because the part formed by a solder ball exhibits flexibility, the stress that develops because of a difference in thermal expansion between the printed circuit board and the package, which was a problem in the past, is absorbed, thereby enabling an improvement in the reliability of connections after they are made. Using the continuity checking terminals, it is possible to stack packages to achieve improved mounting density.

What is claimed is:

1. A semiconductor device package comprises a multi-layer laminated substrate comprising a metallic base substrate around a semiconductor chip, an insulation layer and a metallic film layer having a configuration formed in a predeterminedly designed wiring pattern, and wherein at least one continuity checking terminal is provided at a portion of said metallic base substrate in said multi-layer laminated substrate and opposite to a part of said wiring pattern, said continuity checking terminal being separated from said metallic base substrate and also being electrically insulated from said metallic base substrate, further wherein at least one solder ball is provided on a surface of said wiring pattern which is a reverse side of a surface thereof being opposite to said metallic base substrate, and at a point on said wiring pattern opposite to a point at which said continuity checking terminal is provided.

2. A semiconductor device package according to claim 1, wherein said continuity checking terminal is formed with said wiring pattern so as to be flexible to said metallic base substrate.

3. A semiconductor device package according to claim 1, wherein said continuity checking terminal and a predetermined part of said wiring pattern are connected to each other through a via hole provided in said insulation layer.

4. A semiconductor device package according to claim 1, wherein at least a part of said wiring pattern is connected to at least one of connecting pad formed on said semiconductor chip which is mounted on a surface of said metallic base substrate through a suitable connecting means.

5. A semiconductor device package according to claim 4, wherein said semiconductor chip, said connecting means and a part of said wiring pattern are sealed with a suitable sealing material.

6. A semiconductor package according to claim 1, wherein a part for mounting said semiconductor chip is flat and on the same plane as said metallic base substrate.

7. A semiconductor package according to claim 1, wherein a part for mounting said semiconductor chip has a depression formed therein, said semiconductor chip being mounted within said depression.

8. A semiconductor package according to claim 1, wherein a connection between a mounted semiconductor chip and said package is made by a method selected from a wire bonding method, a solder ball method in which a solder ball is formed on said semiconductor chip, and a flip-chip method.

9. A semiconductor package according to claim 1, wherein said semiconductor chip mounting part and said semiconductor chip are connected and mounted by using either a low-melting-point metal or a resin containing an organic metal.

10. A semiconductor package according to claim 1, wherein said sealing material is an organic resin.

11. A semiconductor package according to claim 1, wherein said metallic base substrate and metallic foil layer are made of either copper or aluminum.

12. A semiconductor device package according to claim 1, wherein on said chip mounting portion to which a semiconductor chip is mounted, no insulation layer and no metallic film layer is provided.

13. A semiconductor device package according to claim 1, wherein a mounting material is provided on said chip mounting portion.

14. A semiconductor device which comprises a plurality of said semiconductor device packages as defined by the claim 1, and each of which being stacked to each other one on other so that a continuity checking terminal of one semiconductor device package is mutually connected to a solder ball formed on another semiconductor device package which is stacked over the former one.

* * * * *